(12) United States Patent
Derderian

(10) Patent No.: US 6,951,813 B2
(45) Date of Patent: Oct. 4, 2005

(54) METHODS OF FORMING METAL-CONTAINING LAYERS INCLUDING A METAL BONDED TO HALOGENS AND TRIALKYLALUMINUM

(75) Inventor: Garo J. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/406,854

(22) Filed: Apr. 4, 2003

(65) Prior Publication Data
US 2004/0198025 A1 Oct. 7, 2004

(51) Int. Cl.[7] .................. H01L 21/44; H01L 21/31; H01L 21/469
(52) U.S. Cl. .............. 438/653; 438/654; 438/685; 438/785
(58) Field of Search ............... 438/653, 654, 438/655, 785, 778

(56) References Cited

U.S. PATENT DOCUMENTS

| | | | |
|---|---|---|---|
| 6,339,491 B1 | 1/2002 | Kondou et al. | 359/212 |
| 6,509,280 B2 | 1/2003 | Choi | 439/778 |
| 6,570,253 B1 * | 5/2003 | Lim et al. | 257/758 |
| 2001/0024387 A1 | 9/2001 | Raaijmakers et al. | 365/200 |
| 2001/0041250 A1 | 11/2001 | Werkhoven et al. | 428/212 |
| 2002/0000598 A1 * | 1/2002 | Kang et al. | 257/301 |
| 2004/0197527 A1 * | 10/2004 | Maula et al. | 428/172 |

OTHER PUBLICATIONS

"*Growth Kinetics and initial stage growth during plasma–enhanced Ti aromic deposition*"; H. Kim and S. M. Rossnagel; J. Vac. Sci. Technol. A20(3) May/Jun. 2002; American Vacuum Society; pp. 802–808.

"*Trimethylaluminum as a Reducing Agent in the Atomic Layer Deposition of Ti(11)N Thin Films*"; Marika Juppo, Petra Alen, Mikko Ritala, and Markku Leskel s; Chem. Vap. Deposition 2001, 7, No. 5; pp. 211–217.

* cited by examiner

Primary Examiner—William M. Brewster
(74) Attorney, Agent, or Firm—Wells St. John P.S.

(57) ABSTRACT

The invention includes methods of forming metal-containing layers. The layers can, in particular aspects, consist essentially of metal, or consist of metal. The desired layers can be formed by initially depositing a metal-containing layer which comprises metal and halogen atoms. Subsequently, trialkylaluminum is utilized to remove the halogen atoms from the layer. The layer remaining after removal of the halogen atoms can comprise, consist essentially, or consist of any suitable metal, and in particular aspects can consist essentially of, or consist of, titanium or titanium/aluminum.

9 Claims, 4 Drawing Sheets

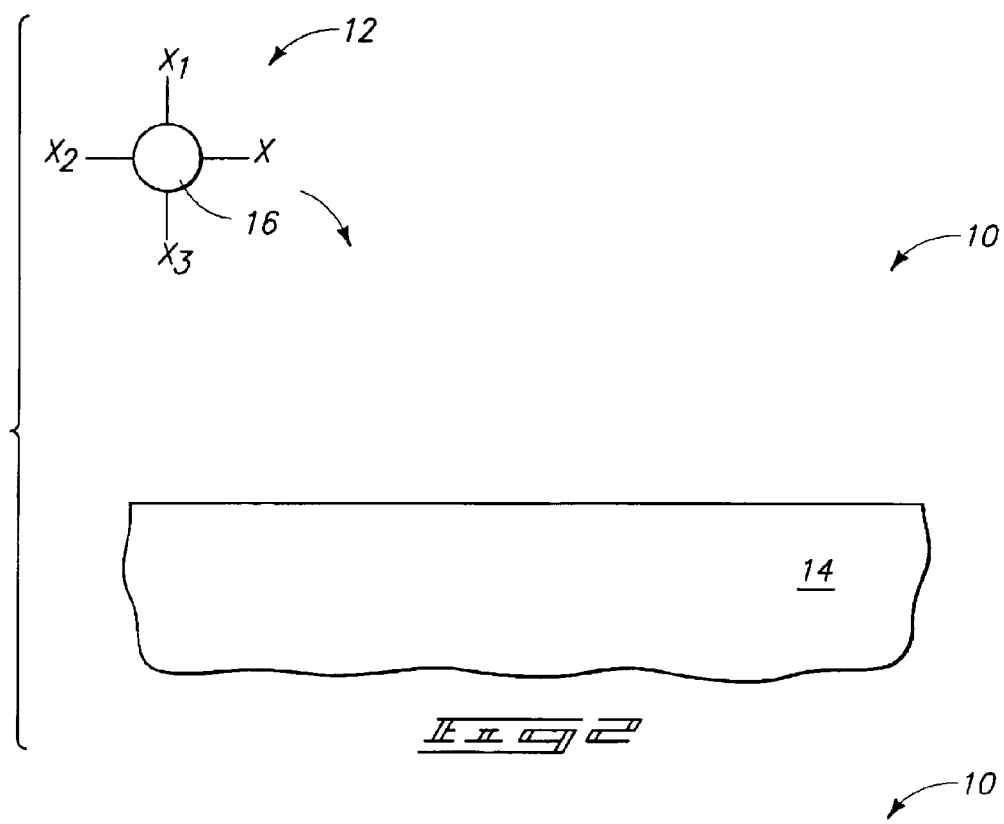
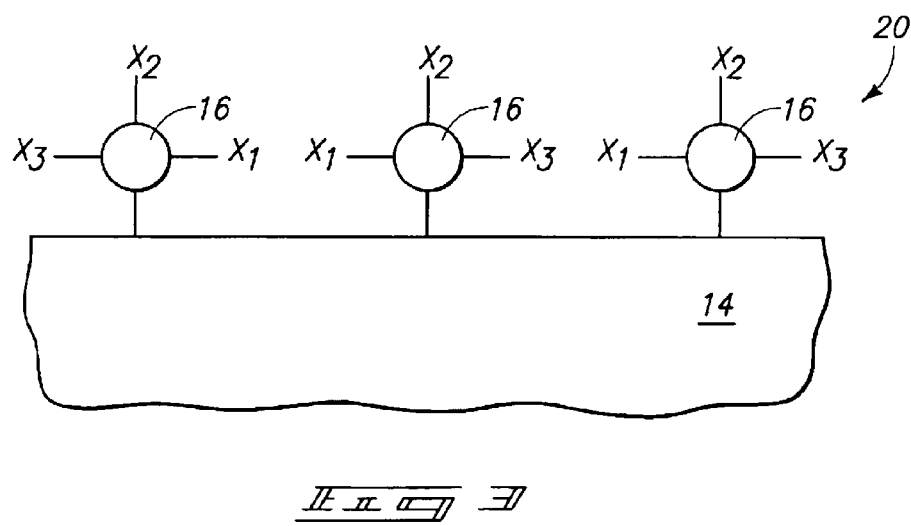

METHODS OF FORMING METAL-CONTAINING LAYERS INCLUDING A METAL BONDED TO HALOGENS AND TRIALKYLALUMINUM

TECHNICAL FIELD

The invention pertains to methods of forming layers containing metal.

BACKGROUND OF THE INVENTION

Metal-containing layers have numerous applications for fabrication of semiconductor devices. It is frequently desired to precisely control the composition of the metal-containing layers in order to obtain desired operating parameters of devices formed from the layers. One type of metal-containing layer that can be particularly useful, and yet which can also be particularly difficult to form, is a layer having a very high concentration of metal, such as, for example, a layer consisting essentially of metal, or a layer consisting of metal. Accordingly, it is desired to develop improved methodologies for forming layers consisting essentially of metal, and layers consisting of metal.

SUMMARY OF THE INVENTION

In one aspect, the invention includes a method of forming a layer consisting essentially of, or consisting of, metal. A metal-containing layer is deposited. The metal-containing layer comprises one or more halogen atoms in addition to the metal. The metal-containing layer is exposed to trialkylaluminum to remove the halogen atoms, and thereby convert the metal-containing layer to either a layer consisting essentially of metal, or a layer consisting of metal.

In one aspect, the invention encompasses an atomic layer deposition method of forming a layer of metal. A substrate is provided in a reaction chamber and exposed to at least one iteration of the following sequence. A reactant is flowed into the reaction chamber. The reactant comprises metal bonded to halogen atoms, and is utilized to form a first layer over the substrate. The first layer comprises the metal of the reactant, as well as one or more halogen atoms from the reactant. Subsequently, the reactant is substantially entirely purged from within the reaction chamber, and the first layer is then exposed to trialkylaluminum. The trialkylaluminum removes the halogen atoms from the first layer, and thus converts the first layer to a layer consisting essentially of, or consisting of, metal. Subsequently, the trialkylaluminum is substantially entirely purged from within the reaction chamber.

The reactant utilized in one or more of the above-described iterations can comprise $TiCl_4$, and the layer resulting from exposure of the first layer to trialkylaluminum can consist essentially of, or consist of, titanium or titanium/aluminum.

BRIEF DESCRIPTION OF THE DRAWINGS

Preferred embodiments of the invention are described below with reference to the following accompanying drawings.

FIG. 2 is a diagrammatic, cross-sectional view of a semiconductor wafer fragment at a preliminary processing stage of an exemplary aspect of the present invention.

FIG. 3 is a view of the FIG. 2 wafer fragment shown at a processing stage subsequent to that of FIG. 2.

DETAILED DESCRIPTION OF THE PREFERRED EMBODIMENTS

Figure 1:
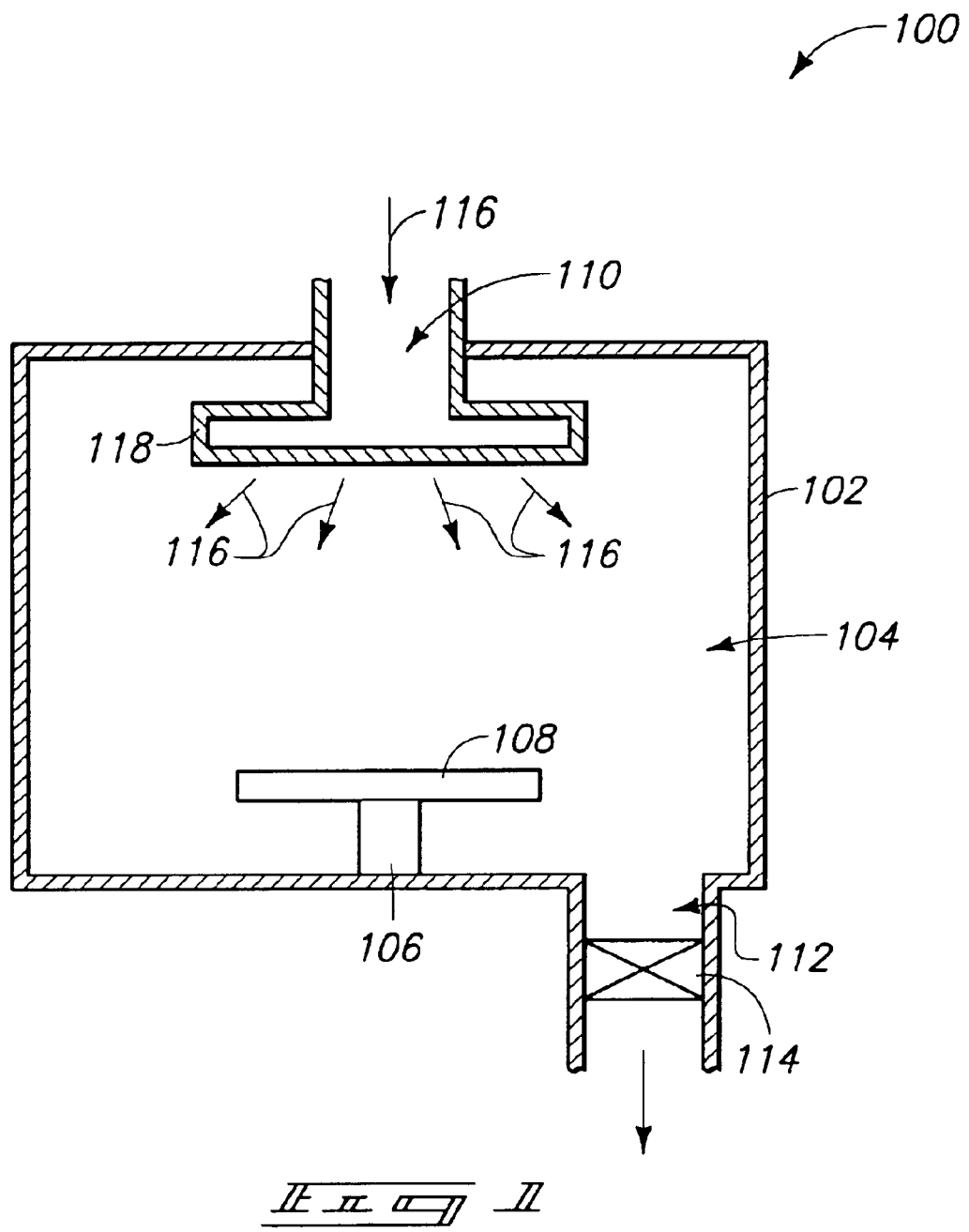
FIG. 1 is a diagrammatic, cross-sectional view of an exemplary apparatus that can be utilized for semiconductor wafer processing in accordance with various aspects of the present invention.

This disclosure of the invention is submitted in furtherance of the constitutional purposes of the U.S. Patent Laws "to promote the progress of science and useful arts" (Article 1, Section 8).

Thin uniform layers consisting essentially of metal, or consisting of metal, are desired for numerous structures associated with semiconductor constructions. For instance, thin uniform layers consisting essentially of titanium, or consisting of titanium, are desired for utilization in contacts to lower contact resistance. Other applications for thin metal films include, for example, utilization in shallow junction devices.

One aspect of the invention is to take advantage of the reductive properties of aluminum-containing materials relative to halogenated transition metal compounds in an atomic layer deposition (ALD) process, chemical vapor deposition (CVD) processes, and processes having predominately ALD characteristics with minor CVD characteristics.

In an exemplary ALD process, titanium tetrachloride ($TiCl_4$) can be flowed across a semiconductor substrate. Some of the $TiCl_4$ can be chemisorbed on the substrate under particular conditions, and any excess $TiCl_4$ can then be pumped/purged away. The chemisorbed material will comprise titanium bonded to chlorine. The chemisorbed material can be subsequently exposed to an aluminum-containing material, such as, for example, trimethylaluminum (TMA) or triethylaluminum (TEA), to remove the halogen atoms (in this case chlorine) and leave a layer consisting essentially of titanium or titanium/aluminum, or to leave a layer consisting of titanium or titanium/aluminum.

A possible mechanism by which TMA can remove the chlorine atoms from the chemisorbed material is that the TMA can react with the Cl ligands and form dimethylaluminum chloride and methane radical ($CH_3$) and/or methane ($CH_4$). Alternatively, if the aluminum-containing material is TEA, the products resulting from reaction of the aluminum-containing material with the chlorine can be diethylaluminum chloride and one or both of ethane radical ($C_2H_5$) and ethane ($C_3H_6$). The mechanism is described herein to assist the reader in understanding methodology of the present invention, and is not to be limiting to this invention except to the extent, if any, that such mechanism is expressly recited in the claims that follow.

Regardless of whether TMA is utilized, TEA is utilized, or an alternative trialkylaluminum precursor is utilized, the products resulting from reaction of the precursor with the chemisorbed material are generally volatile, and can be flushed away from the metal of the chemisorbed layer to leave a layer consisting essentially of metal, or consisting of metal. Specifically, the by-products of trialkylaluminum reaction with the chemisorbed layer will typically be chloride-containing gases. The chloride-containing gases can be pumped/purged away.

The above-described ALD process can be repeated until a desired thickness of metal is achieved. Each monolayer of the metal will typically have a thickness of from about 1 Å to about 4 Å, and typically a minimal thickness for a structure utilized in a semiconductor device is about 10 Å. Accordingly, there will typically be at least two of the ALD cycles, and more typically at least ten of the ALD cycles, utilized to form a thin layer of metal for a semiconductor application.

In the above-described aspect of the invention in which the metal-containing precursor is $TiCl_4$, the resulting layer consisting essentially of, or consisting of metal, can comprise either titanium alone, or a mixture of titanium and aluminum. Whether the layer comprises titanium alone or titanium/aluminum will depend on whether all of the aluminum from the trialkylaluminum precursor is flushed from the layer. In some aspects, the layer can comprise from about 2 atomic percent to about 14 atomic percent aluminum. In some aspects, the layer will comprise effectively 0 atomic percent aluminum, and accordingly can consist essentially of titanium, or consist of titanium.

The process described above would typically occur in a reaction chamber. An exemplary reaction chamber 100 is shown in FIG. 1. Reaction chamber 100 comprises a vessel 102 having an interior region 104. A wafer holder 106 is provided within the interior of the vessel, and a wafer 108 is shown supported by holder 106. An inlet 110 extends through vessel 102 for introduction of materials into the vessel, and an outlet 112 is provided for exhausting materials from within the interior of the vessel. A valve 114 is shown associated with the outlet 112, and such valve can be utilized to control a pressure within the interior of the vessel during a wafer treatment process.

In operation, a suitable reactant (with the term "reactant" encompassing, among other things, a metal-containing precursor) is flowed through inlet 110, as is diagrammatically illustrated by arrow 116. In the shown application, inlet 110 leads to a disperser 118 (such as, for example, a showerhead), which disperses the reactant across a surface of substrate 108. After a suitable pressure of the reactant has been achieved within the vessel, and after the exposure has been conducted for a suitable period of time, the flow of reactant into the vessel can be ceased. Subsequently valve 114 can be opened to release any excess reactant, together with any volatile reaction by-products, from within the vessel.

If apparatus 100 is utilized for an atomic layer deposition process, different reactants will be introduced into vessel 102 sequentially relative to one another so that there is little to no interaction of the reactants at any location other than on a surface of substrate 108. In contrast, if apparatus 100 is utilized for a chemical vapor deposition (CVD) process, multiple reactants will be simultaneously present within chamber 104, and will react with one another throughout the chamber to form a desired material which ultimately forms a deposit over surface 108. In preferred applications of the present invention, apparatus 100 is utilized in an atomic layer deposition process.

An exemplary process can proceed as follows. Initially, the interior region 104 of vessel 102 is heated to a temperature of from about 300° C. to about 500° C., with an exemplary temperature being 400° C. An upper surface of substrate 108 is heated to such temperature and maintained at such temperature. A metal-containing precursor (such as, for example, $TiCl_4$) is flowed into the chamber at a rate of about 100 milligrams per minute. The precursor can be provided by, for example, liquid injection. A total concentration of the $TiCl_4$ within the chamber is ultimately from about 10 milligrams to about 200 milligrams for a chamber having an internal volume of about three liters to about six liters. A pressure within the chamber is provided to be from about 0.5 Torr to about 5 Torr, and a wafer is exposed to the metal-containing precursor for a time of from about 0.5 seconds to about 2 seconds while the pressure, temperature, and concentration of precursor is maintained within the chamber. The precursor can be carried into the chamber utilizing any suitable carrier gas. The carrier gas is typically inert relative to reaction with the precursor. An exemplary carrier gas is argon flowed at a rate of from about 100 standard cubic centimeters per minute (sccm) to about 500 sccm, with a typical flow rate being about 100 sccm. The carrier gas can alternatively be helium utilized at a flow rate of about 1,000 sccm. Treatment is usually for only one wafer at a time within a given reaction chamber, although batch processes can also be utilized.

After the treatment of the substrate with the metal-containing precursor, any unreacted (i.e., excess) precursor is substantially entirely flushed (i.e., purged) from within the chamber. The term substantially entirely flushed is utilized to indicate that the precursor is preferably flushed to the extent that there is no detectable chemical vapor deposition occurring within the chamber. In particular aspects, such can mean that the precursor is entirely flushed from within the chamber, and in other aspects such can mean that the precursor is flushed to the extent that there is so little precursor remaining within the chamber that a chemical vapor deposition process is not detected in subsequent processing. The precursor can be flushed from the chamber utilizing vacuum and/or a suitable purge gas. An exemplary purge gas is argon. The purge cycle can be, for example, from about 0.5 seconds to about 2 seconds.

After the metal-containing precursor has been flushed from within the reaction chamber, the aluminum-containing reactant can be provided within the chamber. In particular processing of the present invention, the aluminum-containing reactant can be one or more trialkylaluminum compounds. The trialkylaluminum compounds can be utilized to remove halogens from a chemisorbed monolayer, and thereby convert the layer from a layer comprising halogen atoms to a layer consisting essentially of metal, or consisting of metal. The trialkylaluminum compounds can be provided within the chamber while the temperature within the chamber is from about 300° C. to about 500° C., and typically about 400° C.; and while the pressure within the chamber is from about 0.5 Torr to about 5 Torr.

The trialkylaluminum compounds can be provided from a bubbler source at room temperature, and can be flowed into the chamber utilizing a carrier gas, such as, for example, argon at a flow rate of from about 5 sccm to about 100 sccm. The semiconductor wafer can be exposed to the trialkylaluminum compounds for a time of from about 0.1 second to about 5 seconds, with 2 seconds being typical.

After the treatment with the trialkylaluminum compounds, any remaining trialkylaluminum compounds (i.e., excess reactant) can be substantially entirely flushed from within the chamber. The purge of the trialkylaluminum compounds can be identical to that described above for removing excess metal-containing precursor.

From the discussion above, it should be understood that an exemplary process can comprise the sequence of: 1)

treating a surface of the substrate 108 with metal-containing precursor; 2) substantially entirely flushing excess metal-containing precursor from within the reaction chamber; 3) exposing substrate 108 to trialkylaluminum compounds; and 4) flushing any unreacted trialkylaluminum compounds, together with reaction by-products, substantially entirely from within the chamber. The sequence can be repeated multiple times to form a metal layer having a desired thickness. In particular aspects, at least two iterations of the sequence will be performed, and in other aspects at least four iterations of the sequence will be performed.

It is noted that the present technique is preferably conducted as a non-plasma technique. This can provide advantages relative to plasma techniques, including, for example, that the methodology of the present invention can utilize less complicated hardware than that utilized in plasma techniques.

An exemplary application of the present invention is described with reference to FIGS. 2–7. Referring initially to FIG. 2, a semiconductor wafer fragment 10 is shown being exposed to a metal-containing precursor 12.

Fragment 10 comprises a substrate 14. The substrate can comprise, for example, monocrystalline silicon having an assortment of layers and integrated circuit devices (not shown) supported thereby. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Precursor 12 comprises a metal atom 16 bonded to a plurality of halogen atoms X, $X_1$, $X_2$, and $X_3$. The halogen atoms can be all the same as one another, or can differ. Although four halogen atoms are shown, it is to be understood that the precursor can, in particular aspects, comprise a different number of halogen atoms. Precursor 12 can be, in particular aspects, referred to as a metal-containing precursor, and in other aspects can be referred to as a Referring to FIG. 3, construction 10 is illustrated after formation of a metal-containing layer 20 over a surface of substrate 14. In particular aspects, layer 20 can be a monolayer. It is noted that layer 20 comprises the metal atoms 16 of precursor 12 (FIG. 2), and also comprises halogen atoms from the precursor. Although each metal atom is shown connected to three halogen atoms, it is to be understood that the number of halogen atoms associated with particular metal atoms in layer 20 can vary.

Monolayer 20 can be formed utilizing the processing described above with reference to FIG. 1. Accordingly, after monolayer 20 is formed, precursor 12 (FIG. 2) can be substantially entirely flushed from within a reaction chamber.

Figure 4:
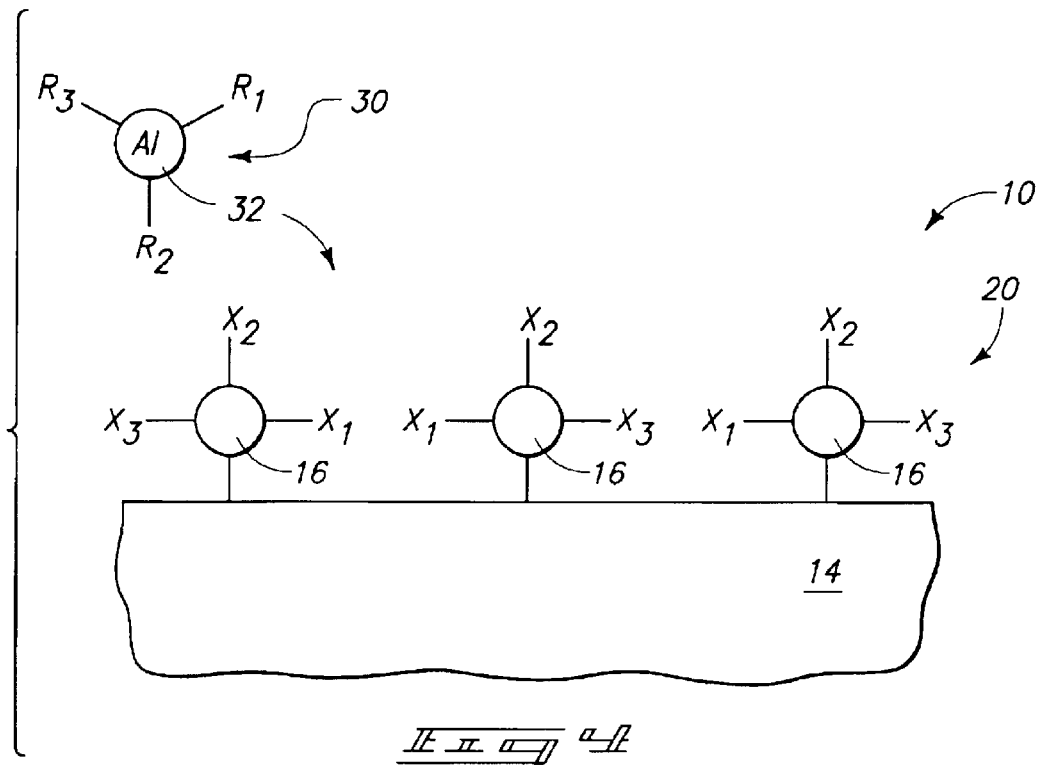
FIG. 4 is a view of the FIG. 2 wafer fragment shown at a processing stage subsequent to that of FIG. 3.

Referring to FIG. 4, monolayer 20 is shown exposed to a trialkylaluminum reactant 30. Reactant 30 is shown comprising an aluminum atom 32 bonded to three alkyl groups ($R_1$, $R_2$, and $R_3$). The three alkyl groups can be the same as one another or different. In particular applications, trialkylaluminum reactant 30 will comprise one or both of TMA and TEA.

Figure 5:
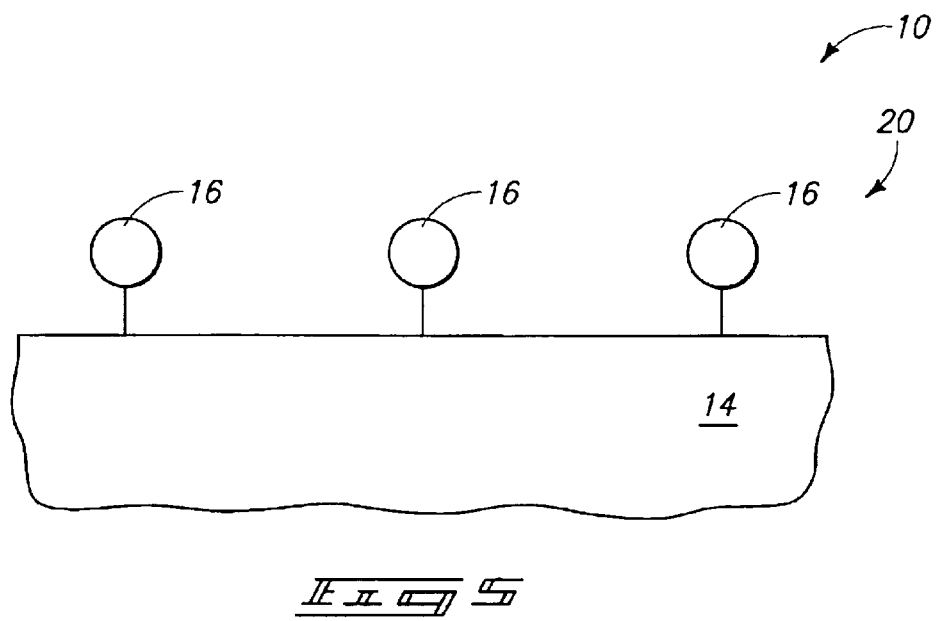
FIG. 5 is a view of the FIG. 2 wafer fragment shown at a processing stage subsequent to that of FIG. 4.

FIG. 5 shows construction 10 after exposure to the trialkylaluminum reactant 30 (FIG. 4), and specifically shows that the halogen atoms $X_1$, $X_2$ and $X_3$ (FIG. 4) have been removed to leave layer 20 consisting essentially of, or consisting of, metal 16. In particular applications, metal 16 will comprise, consist essentially of, or consist of, one or more transition metals. In specific applications, metal 16 can consist essentially of, or consist of, titanium.

Although not shown in FIG. 5, it is to be understood that some of the aluminum from reactant 30 (FIG. 4) can integrate within the metal-containing layer 20 of FIG. 5, and accordingly layer 20 of FIG. 5 can consist essentially of, or consist of, a mixture of the metal 16 from precursor 12 (FIG. 2) and aluminum. In such applications, the aluminum content will typically be from about 2 atomic percent to about 14 atomic percent. Various parameters may affect how much aluminum is incorporated into layer 20. For instance, higher temperatures utilized during treatment with the aluminum-containing reactant may result in lower aluminum incorporation into the metal-containing layer, as may longer purge times following the treatment with the aluminum-containing reactant. Additionally, the length of the pulse of the aluminum-containing reactant may affect the aluminum concentration within layer 20. Alternatively, the amount of aluminum present within film 20 may not be very controllable in a pure ALD process, but it may be sensitive to partial CVD reactions in the process. For instance, if a pulse to remove aluminum-containing reactant is too short, so that some aluminum-containing materials remain in the reaction chamber during subsequent processing, such may lead to aluminum being incorporated into the metal-containing film 20.

After the aluminum-containing reactant 30 (FIG. 4) has been utilized to remove the halogen atoms ($X_1$, $X_2$ and $X_3$ of FIG. 4) the aluminum-containing reactant can be substantially entirely flushed from a reaction chamber, as discussed above with reference to FIG. 1. Such will leave the construction 10 having the layer consisting essentially of, or consisting of, metal 16 as its upper surface within the reaction chamber. Such upper surface can be subsequently treated with metal-containing precursor and trialkylaluminum to form another layer on top of it. This process can be repeated to form a layer consisting essentially of, or consisting of, metal to a desired thickness.

Figure 6:
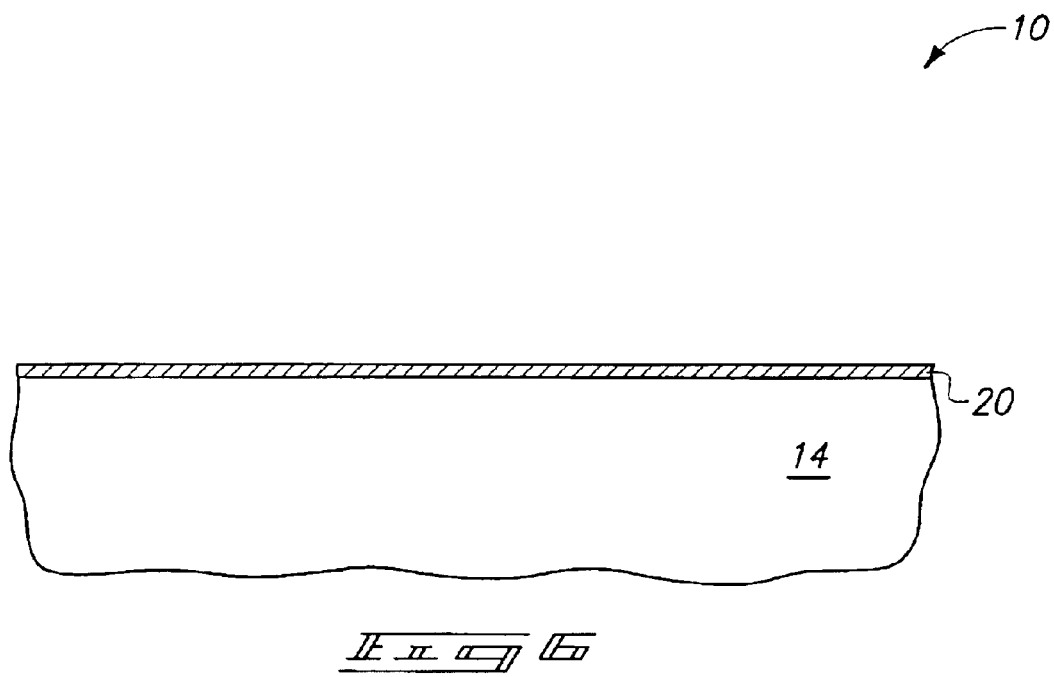
FIG. 6 is a diagrammatic, cross-sectional view of a semiconductor wafer fragment at the processing stage of FIG. 5, utilizing a different diagrammatic illustration than that of FIG. 5.

Referring to FIG. 6, the construction of FIG. 5 is shown utilizing a different diagrammatic illustration. Specifically, layer 20 is shown at a different scale so that the layer appears as a single uniform metallic layer over a surface of substrate 14.

Figure 7:
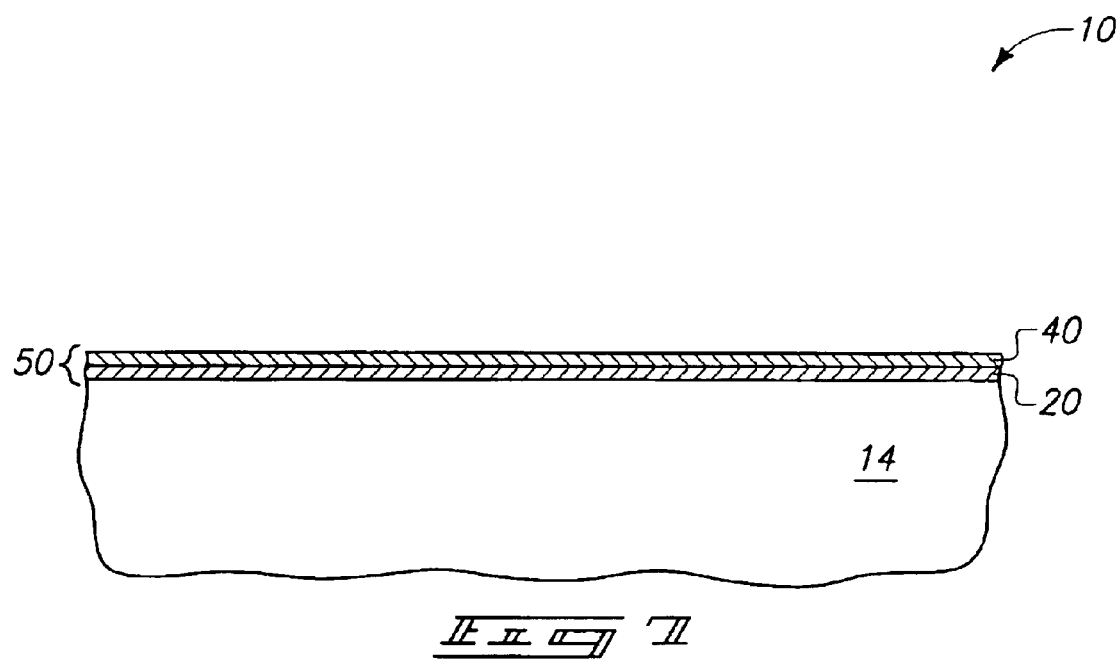
FIG. 7 is a view of the FIG. 6 wafer fragment shown at a processing stage subsequent to that of FIG. 6.

FIG. 7 shows construction 10 after a second metal-containing layer 40 is formed over metal-containing layer 20. Metal-containing layer 40 can be formed utilizing the same process as is utilized for forming metal-containing layer 20. Accordingly, metal-containing layer 40 can consist essentially of, or consist of, metal. In particular aspects, layers 40 and 20 can be substantially identical to one another, and can both consist essentially of, or consist of, for example, titanium or titanium/aluminum. In other aspects, layers 20 and 40 can significantly differ from one another relative to the metallic composition of the layers, and yet both layers can consist essentially of, or consist of, metal. Layers 20 and 40 form a composition having a thickness 50. Processing of the present invention can be repeated until thickness 50 reaches a desired value, such as, for example, until the thickness is at least about 10 Å.

The metal-containing layers formed in accordance with methodology of the present invention can be formed to any suitable thickness. Accordingly, the layers can have thicknesses typically associated with thin films, or can be much thicker. Methodology of the present invention can be utilized to, among other things, form metal-containing layers having good step coverage.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a metal-containing structure, comprising:

providing a substrate in a reaction chamber; and while the substrate is within the chamber, performing at least one iteration of the following sequence:

flowing a first reactant into the reaction chamber; the first reactant comprising metal bonded to halogen atoms; the first reactant forming a first layer over the substrate; the first layer comprising the metal together with halogen atoms from the reactant, the metal being a metal other than aluminum;

flushing the first reactant substantially entirely from within the chamber;

after the flushing of the first reactant from the chamber, exposing the first layer to trialkylaluminum to remove the halogen atoms from the first layer and thereby convert the first layer to a first material consisting of the metal other than aluminum;

flushing the trialkylaluminum substantially entirely from within the chamber;

after flushing the trialkylaluminum from the chamber, flowing the first reactant into the chamber to form a second layer over and in direct physical contact with the first material, the second layer comprising the metal together with halogen atoms from the reactant;

exposing the second layer to trialkylaluminum to convert the second layer to a second material consisting of the metal, the first and second materials together forming a metal-containing structure consisting of the metal other than aluminum.

2. The method of claim 1 wherein at least two iterations of the sequence are performed.

3. The method of claim 1 wherein at least ten iterations of the sequence are performed.

4. The method of claim 1 wherein the metal other than aluminum is a transition metal.

5. The method of claim 1 wherein the metal other than aluminum is titanium.

6. The method of claim 1 wherein the reactant is a metal chloride.

7. The method of claim 1 wherein the reactant is titanium tetrachloride, and wherein the metal other than aluminum is titanium.

8. The method of claim 1 wherein the trialkylaluminum is triethylaluminum.

9. The method of claim 1 wherein the trialkylaluminum is trimethylaluminum.

* * * * *

UNITED STATES PATENT AND TRADEMARK OFFICE
CERTIFICATE OF CORRECTION

PATENT NO. : 6,951,813 B2
APPLICATION NO. : 10/406854
DATED : October 4, 2005
INVENTOR(S) : Garo J. Derderian It is certified that error appears in the above-identified patent and that said Letters Patent is hereby corrected as shown below:

Face Page, Col. 2, Other Publications —
   Add: --"In situ mass spectrometry study on surface reactions in atomic layer deposition of TiN and Ti(Al)N thin films"; Juppo et al.; Dialog Tech Abstract 9/12/02, Chemistry of Materials 2002, Volume 14, Number 1--

Col. 5, line 44 —
   Replace "precursor, and in other aspects can be referred to as a"
   With --precursor, and in other aspects can be referred to as a metal-containing reactant. Precursor 12 can be, for example, $TiCl_4$.--

Signed and Sealed this

Twenty-ninth Day of May, 2007

JON W. DUDAS
*Director of the United States Patent and Trademark Office*